United States Patent
Inoue et al.

(10) Patent No.: US 8,673,082 B2
(45) Date of Patent: Mar. 18, 2014

(54) CRUCIBLE AND DEPOSITION APPARATUS

(75) Inventors: Satoshi Inoue, Osaka (JP); Shinichi Kawato, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/980,875

(22) PCT Filed: Jan. 13, 2012

(86) PCT No.: PCT/JP2012/050581
§ 371 (c)(1),
(2), (4) Date: Jul. 19, 2013

(87) PCT Pub. No.: WO2012/099012
PCT Pub. Date: Jul. 26, 2012

(65) Prior Publication Data
US 2013/0291796 A1 Nov. 7, 2013

(30) Foreign Application Priority Data
Jan. 20, 2011 (JP) ................................ 2011-010174

(51) Int. Cl.
*C23C 16/00* (2006.01)
(52) U.S. Cl.
USPC ......................................... 118/726; 118/727
(58) Field of Classification Search
USPC ................................................ 118/726, 727
See application file for complete search history.

(56) References Cited

U.S. PATENT DOCUMENTS

| 3,015,013 | A | * | 12/1961 | Laszlo | 392/420 |
| 4,787,737 | A | * | 11/1988 | Ogawa et al. | 353/57 |
| 4,791,273 | A | * | 12/1988 | Satoh et al. | 392/389 |
| 6,237,529 | B1 | | 5/2001 | Spahn | |

FOREIGN PATENT DOCUMENTS

| JP | 2008-163365 A | 7/2008 |
| JP | 2009-280861 A | 12/2009 |
| JP | 2010-13731 A | 1/2010 |

OTHER PUBLICATIONS

International Search Report received for PCT Patent Application No. PCT/JP2012/050581, mailed on Feb. 21, 2012, 4 pages (2 pages of English Translation and 2 pages of PCT Search Report).

* cited by examiner

*Primary Examiner* — Keath Chen
(74) *Attorney, Agent, or Firm* — Morrison & Foerster LLP

(57) ABSTRACT

A crucible (50) of the present invention includes: an opening (55a) from which vapor deposition particles are injected toward a film formation substrate on which a film is to be formed; a focal point member (54a), provided so as to face the opening (55a), which reflects vapor deposition particles injected from the opening (55a); and a revolution paraboloid (55b) which reflects, toward the film formation substrate, vapor deposition particles which have been reflected by the focal point member (54a).

13 Claims, 16 Drawing Sheets

CRUCIBLE AND DEPOSITION APPARATUS

CROSS REFERENCE TO RELATED APPLICATIONS

This is a U.S. National Phase patent application of PCT/JP2012/050581, filed Jan. 13, 2012, which claims priority to Japanese patent application no. 2011-010174, filed Jan. 20, 2011, each of which is hereby incorporated by reference in the present disclosure in its entirety.

TECHNICAL FIELD

The present invention relates to a crucible and a vapor deposition apparatus each of which is used to form, on a film formation substrate on which a film is to be formed, a film of a pattern made of vapor deposition particles.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of emitting high-luminance light by low-voltage direct-current drive. The organic EL element has a structure in which a first electrode, an organic EL layer, and a second electrode are stacked in this order, and the first electrode is electrically connected to the TFT. As the organic EL layer, an organic layer having a structure in which a hole injection layer, a hole transfer layer, an electron blocking layer, a luminescent layer, a hole blocking layer, an electron transfer layer, an electron injection layer, and the like are stacked together is provided between the first electrode and the second electrode.

A full-color organic EL display device typically includes, as sub-pixels aligned on a substrate, organic EL elements including light emitting layers of red (R), green (G), and blue (B). The full-color organic EL display device carries out color-image display by, with use of TFTs, selectively causing the organic EL elements to each emit light with a desired luminance.

In order to produce an organic EL display device, it is therefore necessary to form, for each organic EL element, a luminescent layer of a predetermined pattern made of an organic luminescent material which emits light of the colors. A layer that is not required to be patterned in shapes for respective organic EL elements is formed collectively in an entire pixel region constituted by the organic EL elements.

Formation of a luminescent layer of a predetermined pattern is performed by a method such as (i) a vacuum vapor deposition method, (ii) an inkjet method, and (iii) a laser transfer method. The production of, for example, a low-molecular organic EL display (OLED) often uses a vapor deposition method.

The vacuum vapor deposition method uses a mask (referred to also as a shadow mask) provided with openings of a predetermined pattern. The mask is fixed in close contact with a vapor-deposited surface of a substrate which vapor-deposited surface faces a vapor deposition source. Then, vapor deposition particles (film formation material) are injected from the vapor deposition source so as to be deposited on the vapor-deposited surface through openings of the mask. This forms a thin film of a predetermined pattern. The vapor deposition is carried out for each color of a luminescent layer (This is called "selective vapor deposition").

Patent Literature 1 described below discloses a technique for (i) allowing a vapor deposition material to efficiently reach a to-be-treated substrate and (ii) causing the vapor deposition material to enter the to-be-treated substrate as perpendicularly as possible.

FIG. 15 is a cross-sectional view illustrating a configuration of a vapor deposition apparatus 100 disclosed in Patent Literature 1. The vapor deposition apparatus 100 includes a vapor deposition chamber 111. Inside the vapor deposition chamber 111, a substrate holder 119 holding a to-be-treated substrate 120 and a mask 131 is provided so as to be located in an upper part of the vapor deposition chamber 111. Inside the vapor deposition chamber 111, a vapor deposition source 112 for supplying vapor deposition particles to the to-be-treated substrate 120 is further provided so as to be located in a lower part of the vapor deposition chamber 111. The mask 131 is provided in place on a bottom surface (film formation surface) of the to-be-treated substrate 120.

The vapor deposition source 112 includes a crucible 140 filled with a vapor deposition material. The crucible 140 is provided directly below a center of the to-be-treated substrate 120, and carries out vapor deposition while the to-be-treated substrate 120 is fixed. The crucible 140 includes a heating container 141 to be filled with a vapor deposition material, a vapor flow nozzle 143a via which a vapor flow is emitted, and a tubular guide member 142 that (i) surrounds a path via which the vapor flow is emitted and (ii) is opened in a direction in which the vapor flow is emitted. The tubular guide member 142 has an inner circumferential surface formed of a flying direction controlling concave curved surface 142d that is a paraboloid for allowing vapor deposition particles having collided with the paraboloid to be reflected in a direction in which the vapor deposition particles are emitted. The vapor flow nozzle 143a is provided at a focal point of the flying direction controlling concave curved surface 142d.

According to the configuration, the vapor deposition material heated in the heating container 141 is emitted, in the form of a vapor flow, via the vapor flow nozzle 143a, and is then deposited on the to-be-treated substrate 120. In this case, the path via which the vapor flow is emitted is surrounded by the flying direction controlling concave curved surface 142d, vapor deposition particles having flown in an oblique direction is reflected by the flying direction controlling concave curved surface 142d and then goes toward the to-be-treated substrate 120. Therefore, since the vapor flow to go toward the to-be-treated substrate 120 while having a small angle of divergence, it is possible to prevent the vapor deposition particles from adhering to an inner wall of the vapor deposition chamber 111. This makes it possible to allow the vapor deposition material to efficiently reach the to-be-treated substrate 120. Further, the vapor deposition particles can enter the to-be-treated substrate 120 as perpendicularly as possible.

CITATION LIST

Patent Literature

Patent Literature 1
Japanese Patent Application Publication, Tokukai, No. 2008-163365 A (Publication Date: Jul. 17, 2008)

SUMMARY OF INVENTION

Technical Problem

Accordingly, the conventional selective vapor deposition method necessitates increasing a mask size as a substrate size increases. However, an increase in mask size causes self-weight bending and extension of the mask. This is more likely to generate a gap, whose size varies depending on a position on the vapor-deposited surface of the substrate, between the substrate and the mask. This makes it difficult to perform highly precise patterning, thereby causing problems such as misplacement of vapor-deposition spots and color mixture. Hence, it is difficult to achieve high resolution.

In addition, the increase in mask size leads to an increase in size and weight of members such as a frame holding the mask and the like. This makes handling of these members difficult, thereby threatening productivity and safety. Furthermore, a vapor deposition apparatus and accompanying apparatuses also increase in size and become complicated. This makes apparatus designing difficult and makes an apparatus installation cost expensive.

Hence, it is difficult to apply the conventional selective vapor deposition method to a large-size substrate. For example, no method that allows selective vapor deposition at a mass production level has been established for a substrate having a size of 60 inches or more.

The problems may be solved by a method (scan vapor deposition method). According to the method, a shadow mask smaller than a substrate is used, and in a state in which a vapor deposition source and the shadow mask are integrated, vapor deposition is carried out while a constant gap is maintained between the shadow mask and the substrate and either the vapor deposition source and the shadow mask thus integrated or the substrate is scanned. An organic film is thus formed in a pattern in a predetermined position on a substrate. A vapor deposition apparatus employing the scan vapor deposition method will be described below with reference to FIGS. 16 and 17.

FIG. 16 is a cross-sectional view illustrating a configuration of a vapor deposition apparatus 200 using the scan vapor deposition method. The vapor deposition apparatus 200 is an apparatus for forming, on a film formation substrate 210, a film made of vapor deposition particles. The vapor deposition apparatus 200 includes a mask 220, a limiting board 230, a shutter 240, and crucibles 250. The film formation substrate 210, the mask 220, the limiting board 230, and the shutter 240 are supported by a frame 260. The crucibles 250 are provided on a supporting base 270.

More specifically, the film formation substrate 210 is supported by a movable supporting section 261 of the frame 260. The movable supporting section 261 is movable in an X-axis direction (a direction toward a viewer of FIG. 16) by a drive system constituted by a stepping motor, a roller, a gear, and the like. In a case where the drive system drives the movable supporting section 261, the film formation substrate 210 is moved in the X-axis direction.

The mask 220 and the limiting board 230 are supported by fixed supporting sections 262 and 263, respectively, of the frame 260.

The shutter 240 is supported by a movable supporting section 264 of the frame 260. As in the case of the movable supporting section 261, the movable supporting section 264 is movable in the X-axis direction by the drive system. In a case where the drive system drives the movable supporting section 264, the shutter 240 is moved in the X-axis direction.

All of members constituting the vapor deposition apparatus 200 are contained in a chamber 280. Further, a vacuum pump mechanism 281 causes an inside of the chamber 280 to be in a vacuum state.

The crucibles 250 are provided in a direction (Y-axis direction) perpendicular to a direction in which the film formation substrate 210 is moved. The crucibles 250 each include a heater 251 and a container 252. The container 252 contains vapor deposition material in solid or liquid form. In a case where the heater 251 heats the container 252, the vapor deposition material is vaporized so as to be vapor deposition particles in gaseous form. The vapor deposition particles are injected from respective openings 253 of the crucibles 250 toward the film formation substrate 210.

FIG. 17 is a perspective view illustrating how the film formation substrate 210, the mask 220, the shutter 240, and the crucibles 250 are arranged. Note that FIG. 17 illustrates no members supporting the film formation substrate 210, the mask 220, the limiting board 230, the shutter 240, and the crucibles 250, respectively.

The film formation substrate 210 is moved (scanned) in the X-axis direction while vapor deposition is carried out. Meanwhile, the mask 220 and the limiting board 230 are fixed. Vapor deposition particles injected from the respective openings 253 of the crucibles 250 pass through openings 231 of the limiting board 230 and openings 221 of the mask 220, and then reach the film formation substrate 210.

In general, vapor deposition particles are radially injected while spreading to some extent. However, in a case where the vapor deposition particles pass through the openings 231 of the limiting board 230, the vapor deposition particles are prevented from spreading.

The openings 221 of the mask 220 are provided at regular intervals. This causes a film to be formed on the film formation substrate 210 in a pattern of a plurality of stripes.

The shutter 240 is used, as needed, to prevent vapor deposition particles from reaching the film formation substrate 210. That is, while a vapor deposition unnecessary region (a region on which the vapor deposition particles are not intended to be vapor-deposited) of the film formation substrate 210 is passing over the mask 220, the shutter 240 is moved to a space between the crucibles 250 and the limiting board 230. This prevents the vapor deposition particles from reaching the film formation substrate 210, so that the vapor deposition particles can be prevented from being vapor-deposited on the vapor deposition unnecessary region.

Note here that according to the configuration, the film formation substrate 210 and the mask 220 are spaced from each other so that the film formation substrate 210 can be moved relatively to the mask 220 (such a method is a so-called gap vapor deposition method). Therefore, in a case where a flow of vapor deposition particles (a vapor deposition flow) has a component that is in an oblique direction with respect to a direction normal to a vapor-deposited surface of the film formation substrate 210, the vapor deposition flow having passed through the mask 220 reaches the film formation substrate 210 at an oblique angle. In this case, a blur in film formation pattern and/or a misplacement of film formation spots may occur. This causes problems (i) such that a production yield is reduced and (ii) such that a high-resolution organic EL panel cannot be formed.

In this regard, according to the vapor deposition apparatus 100 disclosed in Patent Literature 1 and shown in FIG. 15, a vapor deposition flow injected from the vapor deposition nozzle 143a is collimated (parallelized) to some extent, whereas the vapor deposition flow enters the vapor-deposited substrate 120 obliquely to a direction normal to the vapor-deposited substrate 120 as the vapor deposition flow approaches ends of the vapor-deposited substrate 120. In other words, the vapor deposition flow is insufficiently collimated.

Hence, in a case where the technique of Patent Literature 1 is applied to the vapor deposition apparatus 200 using the scan vapor deposition method, it is impossible to obtain a high-resolution film formation pattern without using the limiting board 230 that is thick enough to collimate the vapor deposition flow. However, an increase in thickness of the limiting board 230 leads to an increase in amount of the vapor deposition particles to adhere to wall surfaces of the openings 231 of the restriction plate 230. This causes the vapor deposition particles to be used with lower efficiency.

The present invention has been made in view of the problems, and an object of the present invention is to provide a crucible and a vapor deposition apparatus each of which allows high-precision film formation.

Solution to Problem

In order to attain the object, a crucible of the present invention includes: an opening from which vapor deposition particles are injected toward a film formation substrate on which a film is to be formed; a first reflecting member which is provided so as to face the opening and reflects the vapor deposition particles injected from the opening; and a second reflecting member which reflects, toward the film formation substrate, the vapor deposition particles reflected by the first reflecting member, the second reflecting member having a concave curved surface with respect to the film formation substrate.

According to the configuration, vapor deposition particles injected from the opening are reflected by the first reflecting member and then reflected by the second reflecting member toward the film formation substrate. Since the first reflecting member is provided so as to face the opening and the second reflecting member has the concave curved surface with respect to the film formation surface, the vapor deposition particles reflected by the second reflecting member flow in a direction that is parallel or substantially parallel to a direction normal to the film formation substrate. This makes it possible to form an excellent vapor-deposited film with little inaccuracy of a film formation pattern such as blurring or incorrect positioning. Therefore, it is possible to realize a crucible capable of high-precision film formation.

A vapor deposition apparatus of the present invention includes at least one the crucible mentioned above.

With the configuration, it is possible to realize a vapor deposition apparatus capable of high-precision film formation.

Advantageous Effects of Invention

A crucible of the present invention includes: an opening from which vapor deposition particles are injected toward a film formation substrate on which a film is to be formed; a first reflecting member which is provided so as to face the opening and reflects the vapor deposition particles injected from the opening; and a second reflecting member which reflects, toward the film formation substrate, the vapor deposition particles reflected by the first reflecting member, the second reflecting member having a concave curved surface with respect to the film formation substrate. A vapor deposition apparatus of the present invention includes at least one crucible of the present invention. This brings about a crucible and a vapor deposition apparatus each of which allows high-precision film formation.

Figure 10:
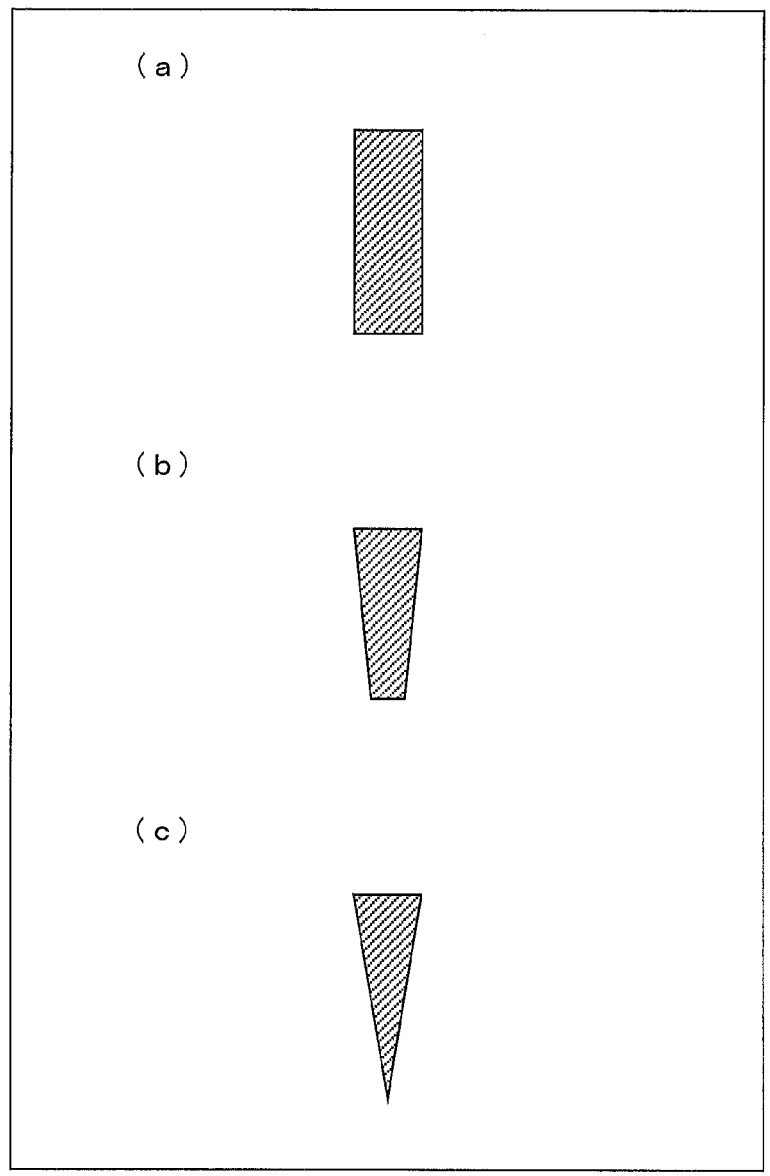

(a) through (c) of FIG. 10 are cross-sectional views each illustrating an example of a horizontal strut for supporting a focal point member.

Figure 11:
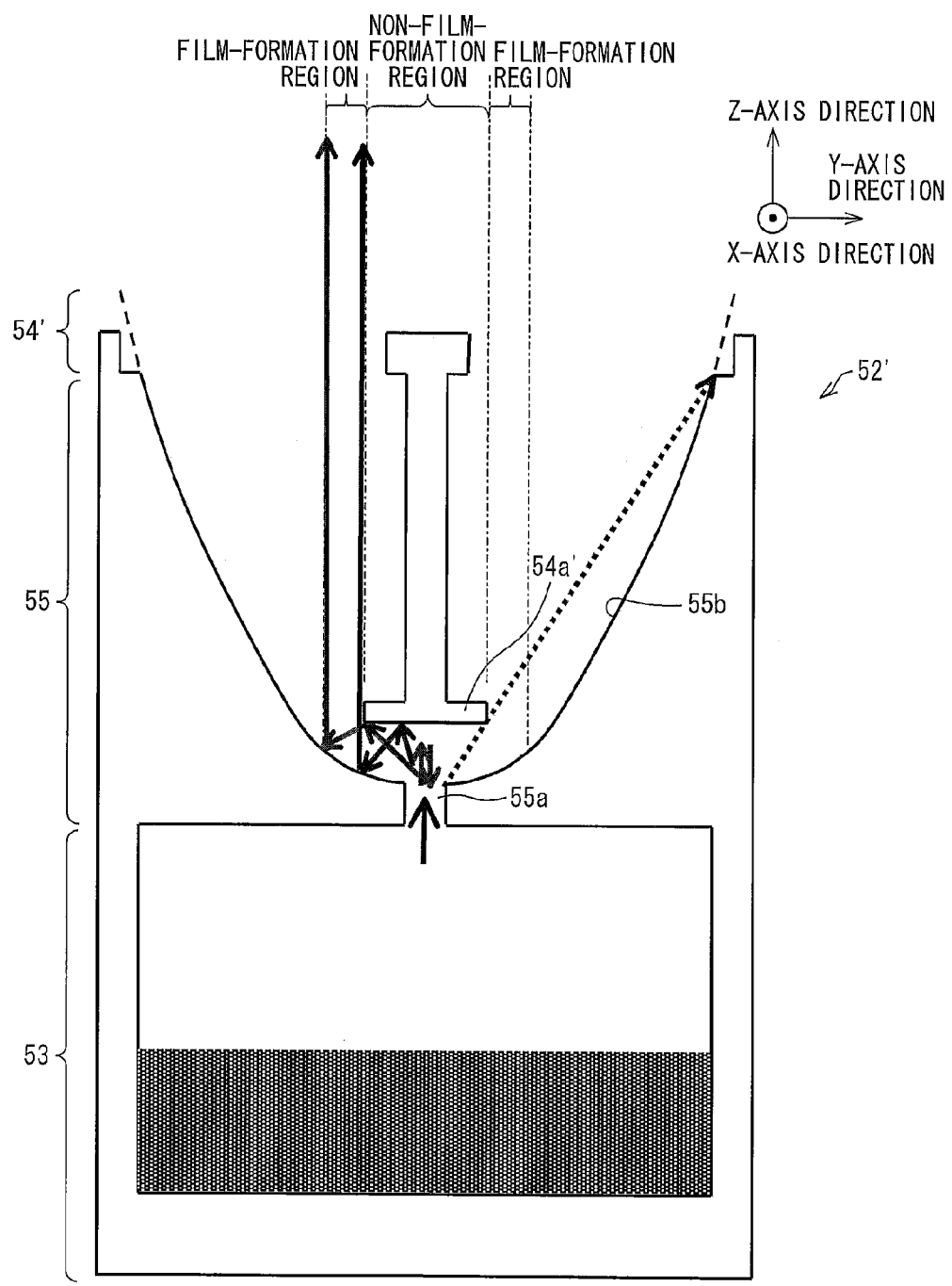

FIG. 11 is a cross-sectional view illustrating a configuration of a container of a crucible in accordance with Embodiment 2.

Figure 12:
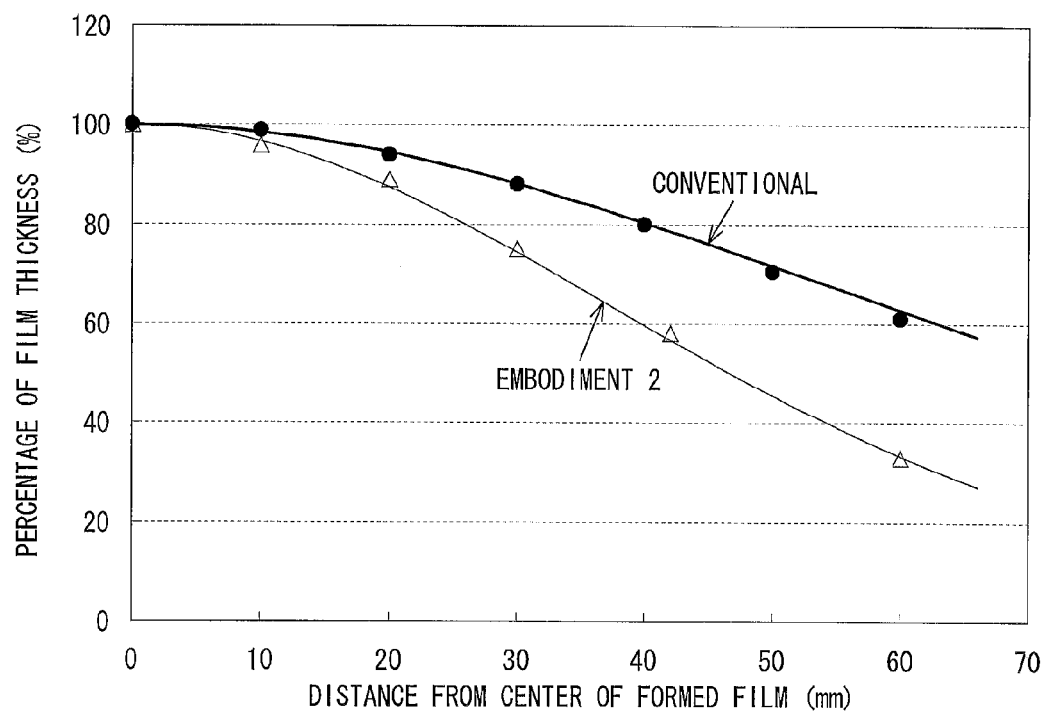

FIG. 12 is graph illustrating film-thickness distributions of vapor deposition particles injected from conventional crucibles and crucibles in accordance with Embodiment 2.

Figure 13:
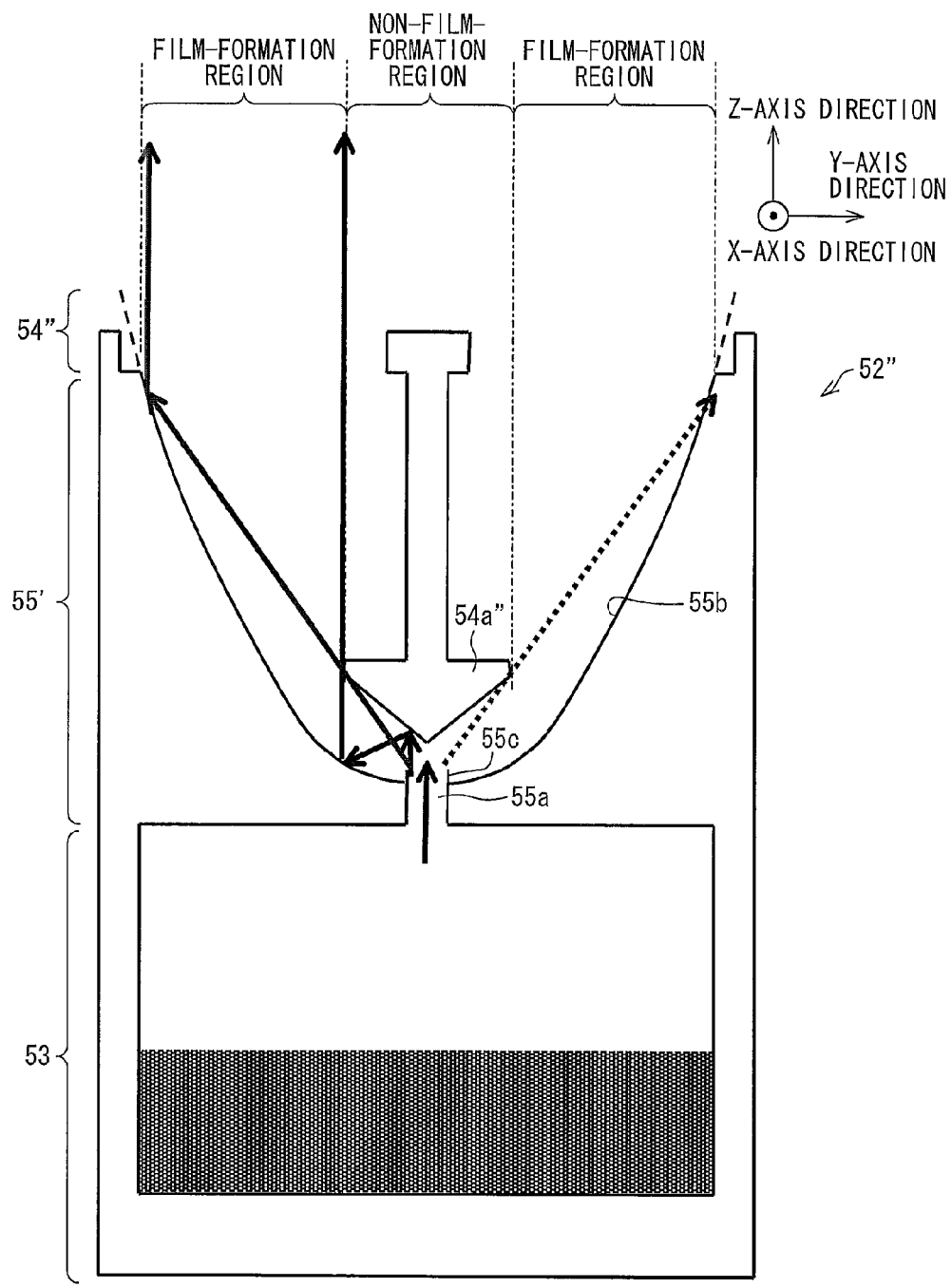

FIG. 13 is a cross-sectional view illustrating a configuration of a container in accordance with Embodiment 3.

Figure 14:
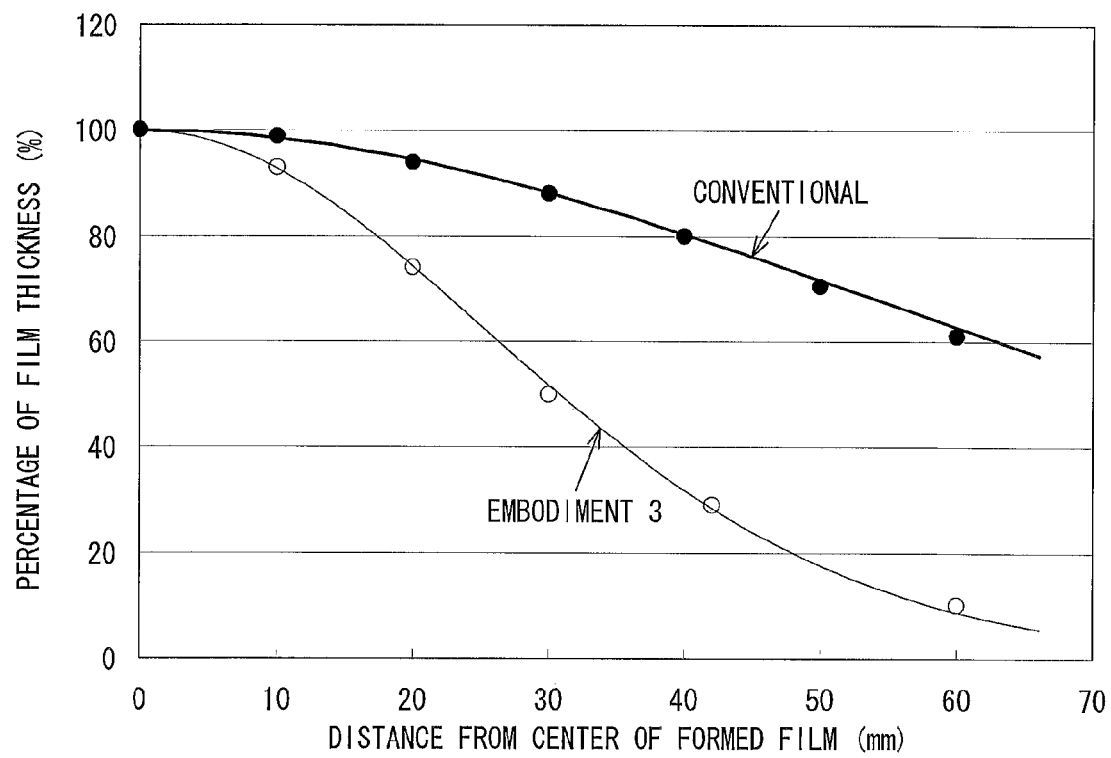

FIG. 14 is a graph illustrating film-thickness distributions of vapor deposition particles injected from conventional crucibles and crucibles in accordance with Embodiment 3.

Figure 15:
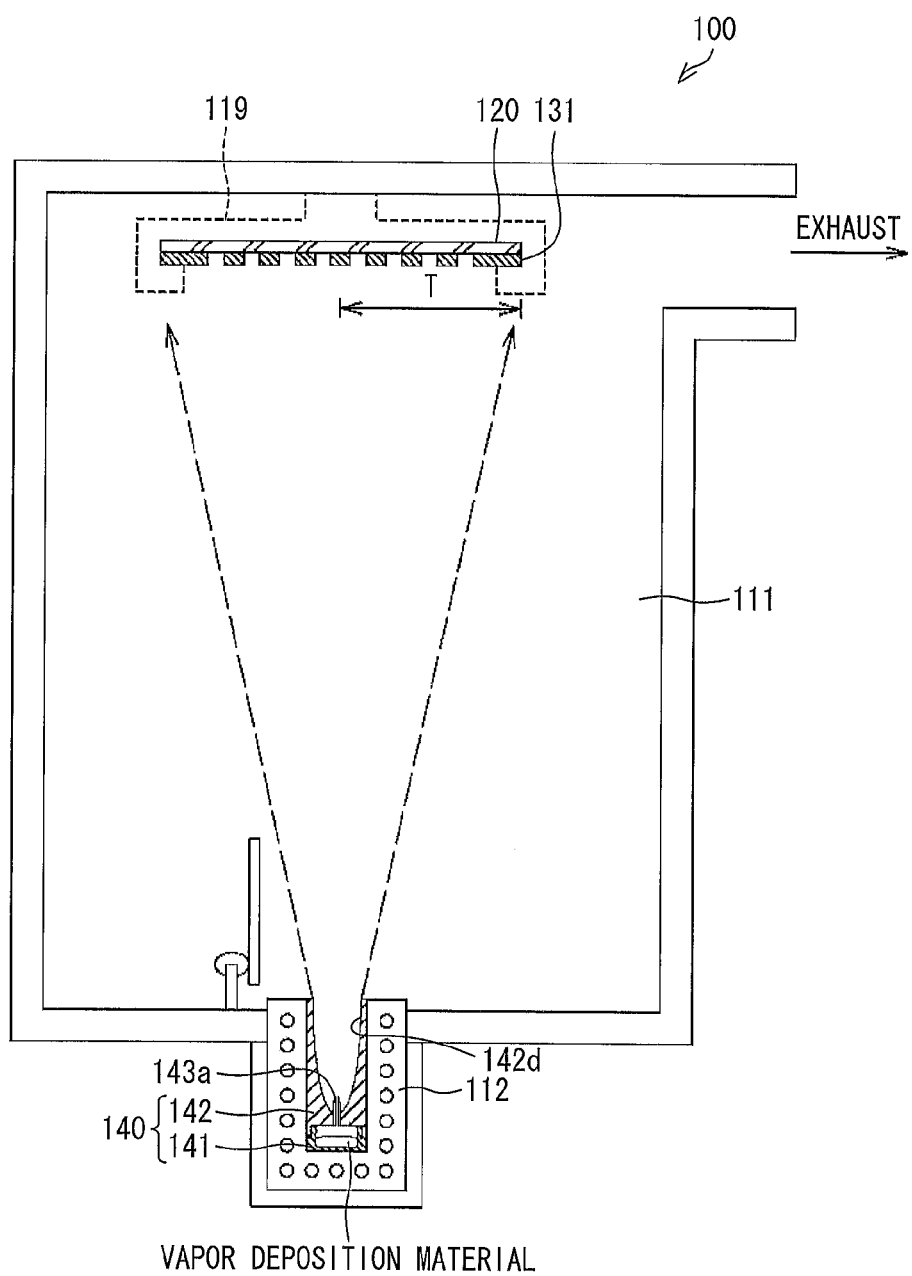

FIG. 15 is a cross-sectional view illustrating a configuration of a conventional vapor deposition apparatus.

Figure 16:
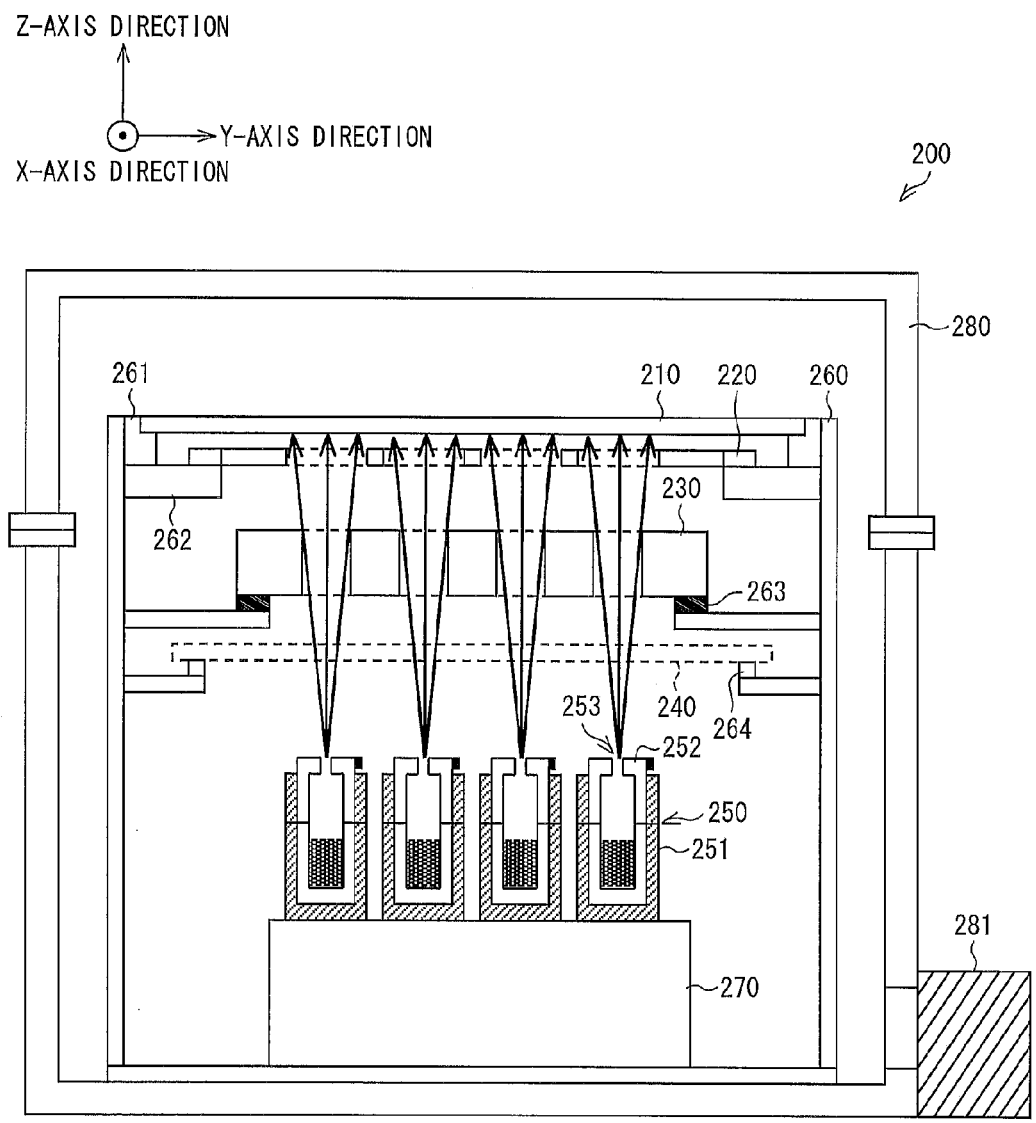

FIG. 16 is a cross-sectional view illustrating a configuration of a vapor deposition apparatus using the scan vapor deposition method.

Figure 17:
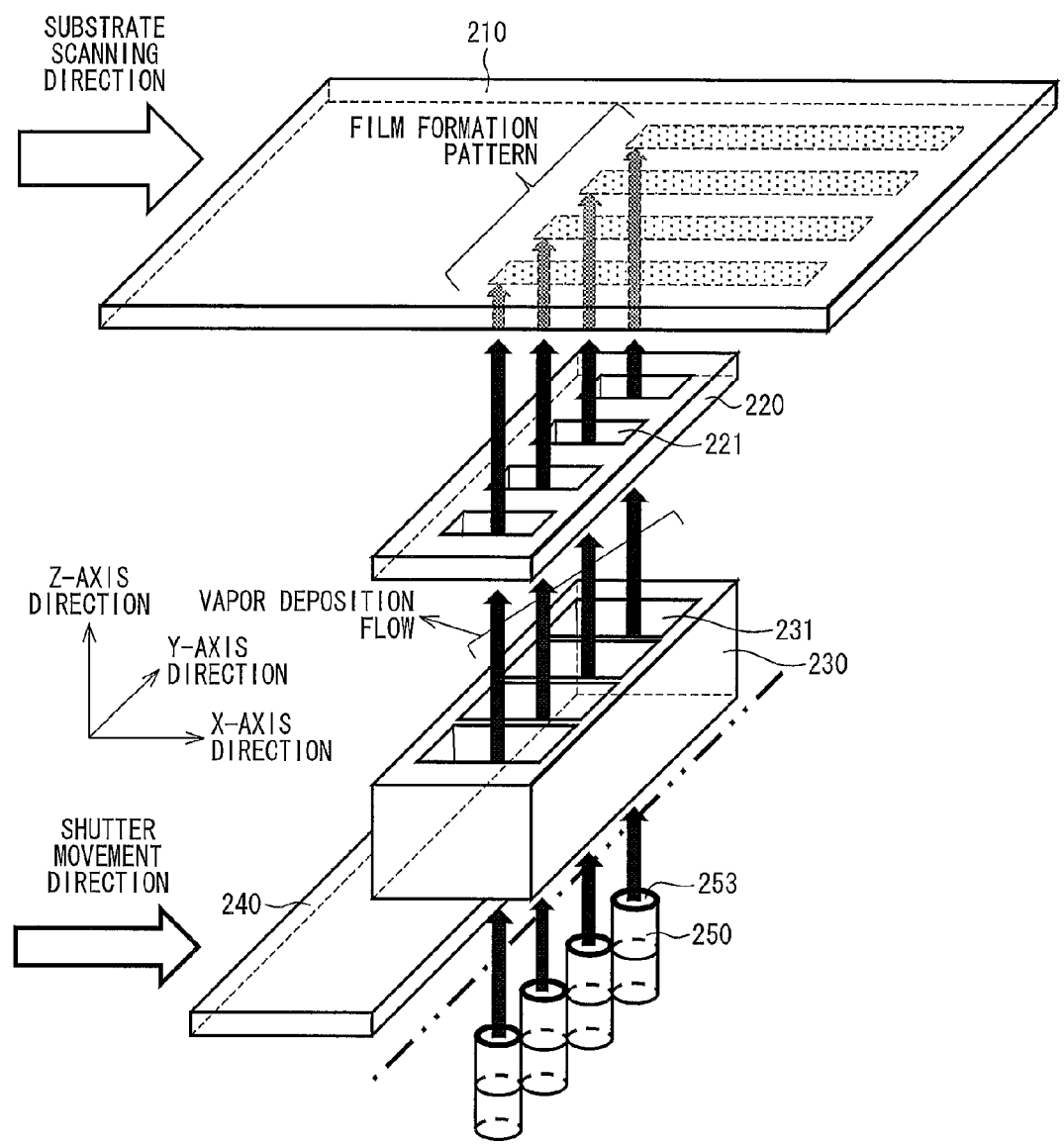

FIG. 17 is a perspective view illustrating how a film formation substrate, a mask, a shutter, and crucibles provided in the vapor deposition apparatus illustrated in FIG. 16 are arranged.

DESCRIPTION OF EMBODIMENTS

Embodiment 1

The following description will discuss Embodiment 1 of the present invention with reference to FIGS. 1 through 10.

Figure 1:
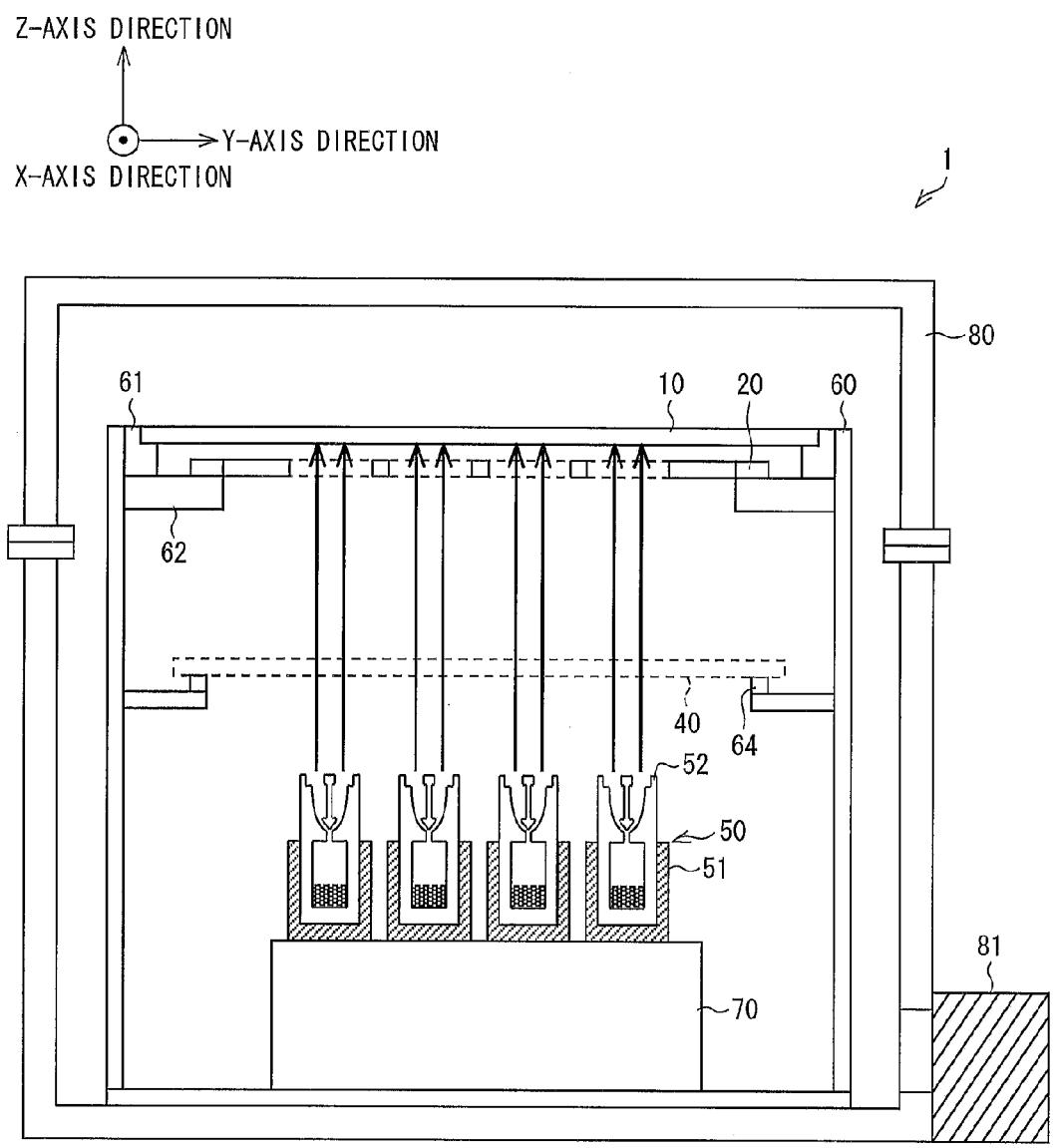
FIG. 1 is a cross-sectional view illustrating a configuration of a vapor deposition apparatus in accordance with Embodiment 1 of the present invention.

FIG. 1 is a cross-sectional view illustrating a configuration of a vapor deposition apparatus 1 in accordance with Embodiment 1. The vapor deposition apparatus 1 is an apparatus for forming, on a film formation substrate 10, a film made of vapor deposition particles. The vapor deposition apparatus 1 includes a mask 20, a shutter 40, and crucibles 50. The film formation substrate 10, the mask 20, and the shutter 40 are supported by a frame 60. The crucibles 50 are provided on a supporting base 70.

More specifically, the film formation substrate 10 is supported by a movable supporting section 61 of the frame 60. The movable supporting section 61 is movable in an X-axis direction (a direction toward a viewer of FIG. 1) by a drive system constituted by a stepping motor, a roller, a gear, and the like. In a case where the drive system drives the movable supporting section 61, the film formation substrate 10 is moved in the X-axis direction.

The mask 20 is supported by a fixed supporting section 62 of the frame 60. The mask 20 has openings corresponding to a pattern in which a film is to be formed on the film formation substrate 10. In a case where a film is formed on the film formation substrate 10 in an all-over pattern, it is unnecessary to provide the mask 20.

The shutter 40 is supported by a movable supporting section 64 of the frame 60. As in the case of the movable supporting section 61, the movable supporting section 64 is movable in the X-axis direction by the drive system. In a case where the drive system drives the movable supporting section 64, the shutter 40 is moved in the X-axis direction. Only during vapor deposition, the shutter 40 is moved out of a path via which a vapor flow is emitted.

All of members constituting the vapor deposition apparatus 1 are contained in a chamber 80. Further, a vacuum pump mechanism 81 causes an inside of the chamber 80 to be in a vacuum state.

The crucibles 50 are provided along a direction (Y-axis direction) perpendicular to both (i) a direction (X-axis direction) in which the film formation substrate 10 is moved relatively and (ii) a direction (Z-axis direction) normal to the film formation substrate 10. The crucibles 50 each include a heater 51 and a reservoir 52. The container 52 contains vapor deposition material in solid or liquid form. In a case where the heater 51 heats the container 52, the vapor deposition material is vaporized so as to be vapor deposition particles in gaseous form. The vapor deposition particles are injected from the respective crucibles 50 toward the film formation substrate 10.

All the members of the vapor deposition apparatus 1 except the crucibles 50 are similar to those of the vapor deposition apparatus 200 illustrated in FIG. 16. In other words, the vapor deposition apparatus 1 is obtained by configuring the vapor deposition apparatus 200 in which the crucibles 250 are replaced with the crucibles 50 and from which the limiting board 230 is omitted.

According to the vapor deposition apparatus 1, the vapor deposition particles injected from the crucibles 50 enter the film formation substrate 10 substantially perpendicularly. In other words, the crucibles 50 inject vapor deposition flows in a direction substantially parallel to the direction normal to the film formation substrate 10. This makes it unnecessary to provide a limiting board for collimating the vapor deposition flows. A configuration which allows injection of parallel vapor deposition flows will be described below with reference to FIGS. 2 through 4.

Figure 2:
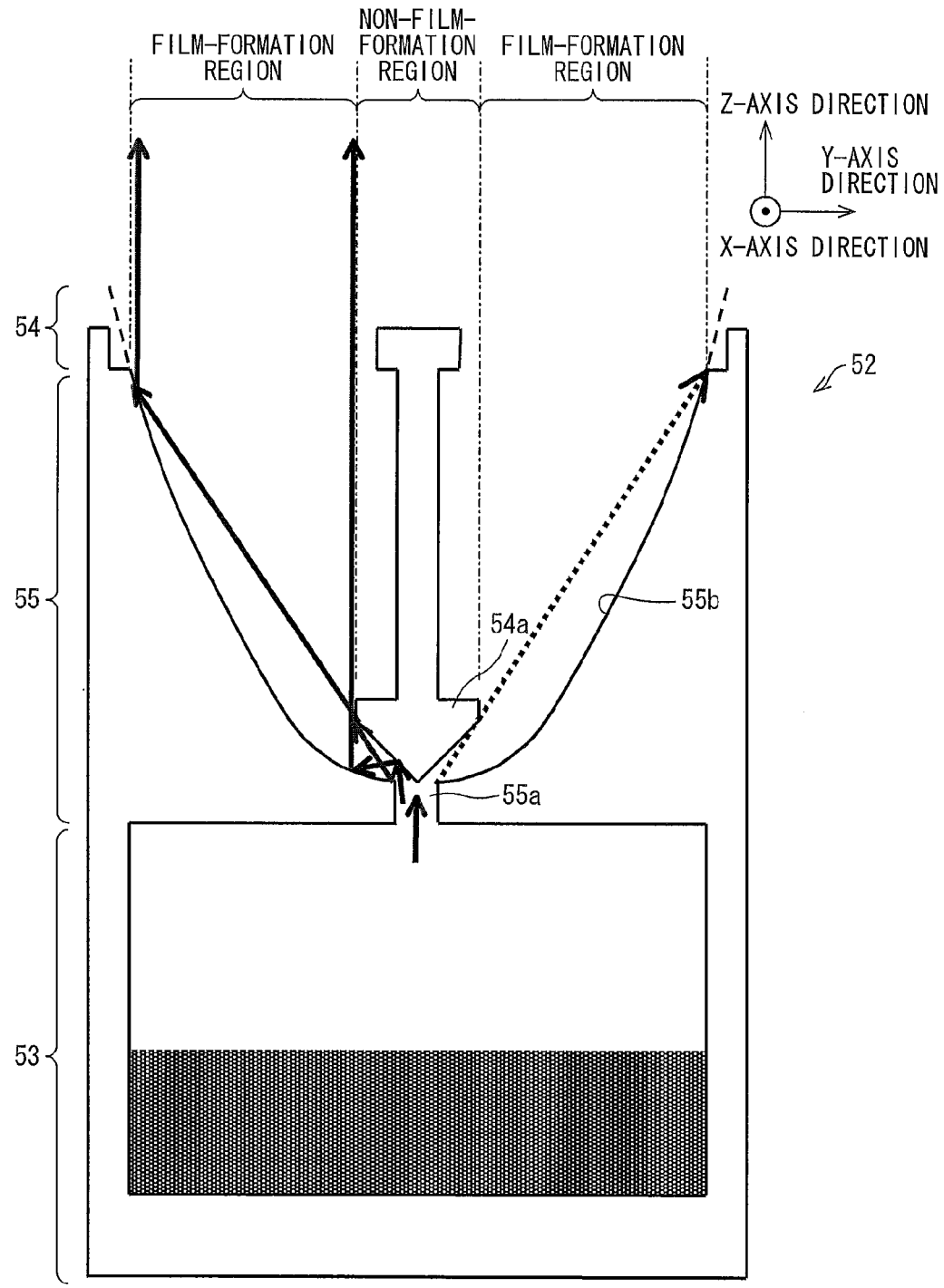
FIG. 2 is an enlarged cross-sectional view illustrating a configuration of a container of a crucible.
Figure 3:
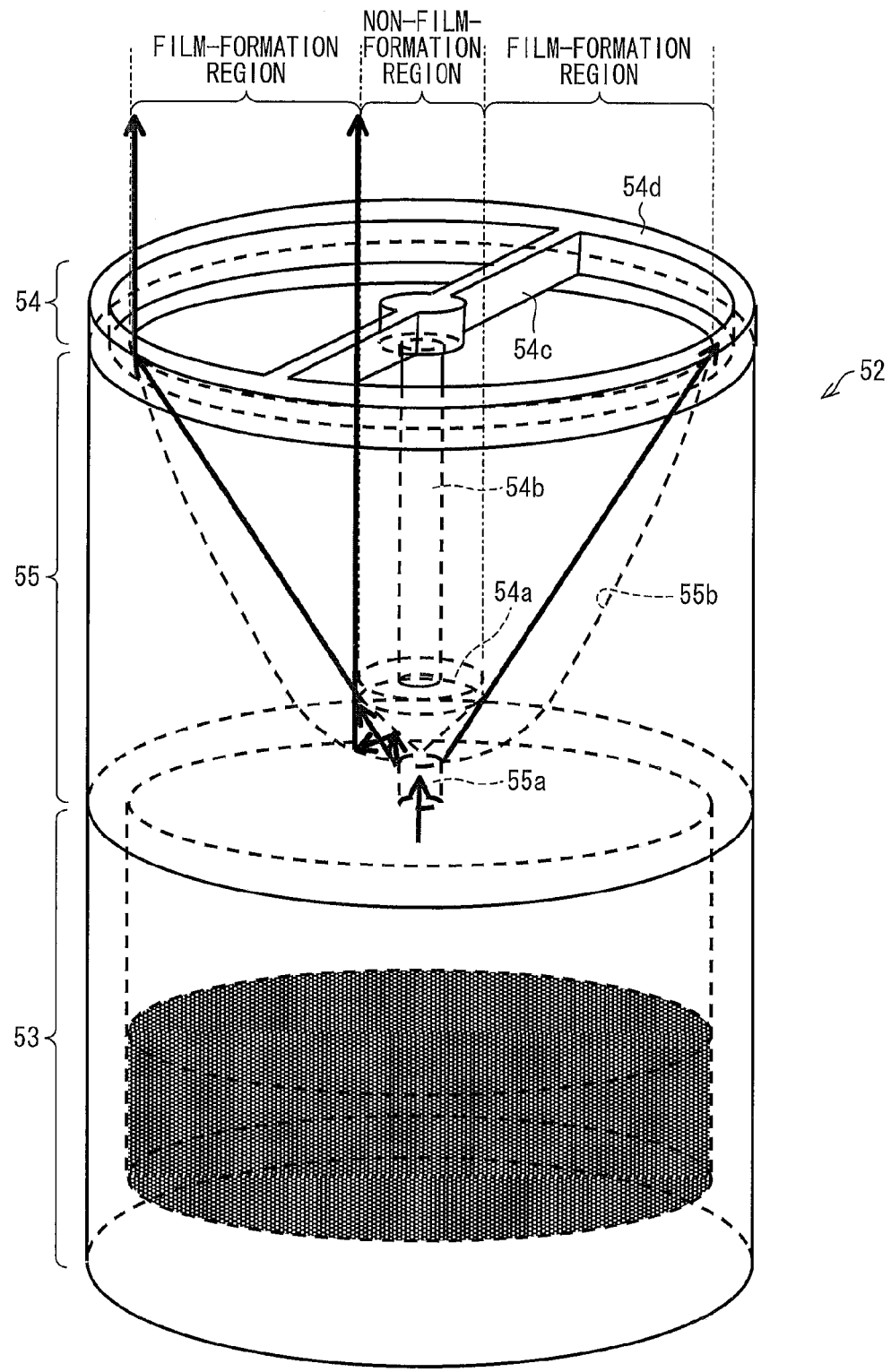
FIG. 3 is an enlarged perspective view illustrating the configuration of the container illustrated in FIG. 2.
Figure 4:
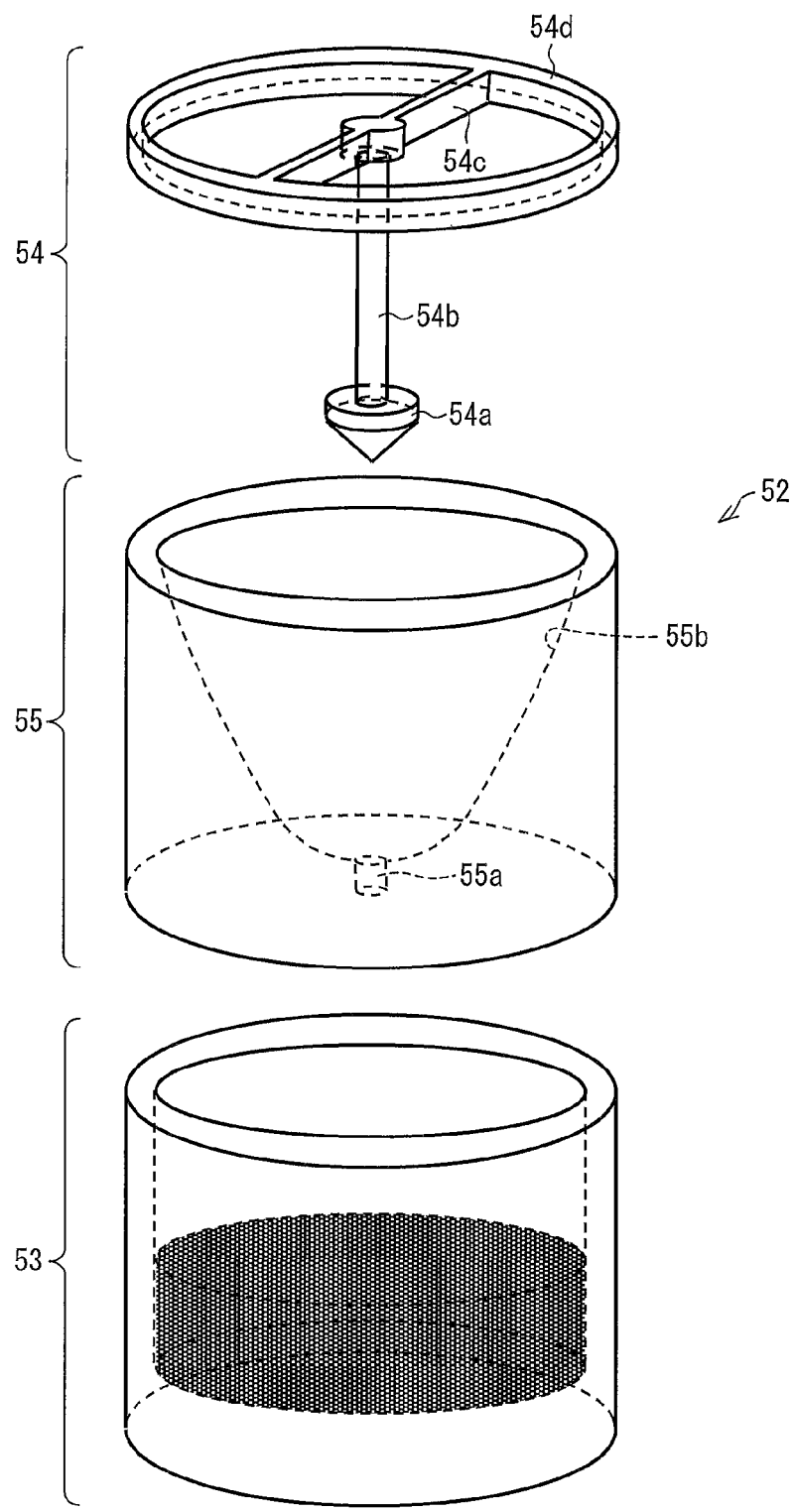
FIG. 4 is an exploded perspective view illustrating the configuration of the container illustrated in FIG. 2.

FIG. 2 is an enlarged cross-sectional view illustrating a configuration of a container 52 of each of the crucibles 50. FIG. 3 is an enlarged perspective view illustrating the configuration of the container 52. FIG. 4 is an exploded perspective view illustrating the configuration of the container 52.

The container 52 includes a vapor deposition source unit 53, a first reflecting member unit 54, and a second reflecting member unit 55. These three members are joined together by, for example, screw processing. Further, the members are desirably configured to be temperature-adjustable independently of one another.

The vapor deposition source unit 53 is a cylindrical container for containing a vapor deposition material.

As illustrated in FIGS. 3 and 4, the first reflecting member unit 54 includes a focal point member 54a, a vertical strut 54b, a horizontal strut 54c, and a circular supporting member 54d.

The horizontal strut 54c is provided so as to connect, through a central part of the circular supporting member 54d, two points on an inner circumferential part of the circular supporting member 54d. The vertical strut 54b has one end that is connected to a midpoint of the horizontal strut 54c and extends downwards. The vertical strut 54b has the other end that is connected to the focal point member 54a. The focal point member 54a corresponds to a first reflecting member recited in the claims.

The second reflecting member unit 55 is a cylindrical member having, therein, an opening 55a and a revolution paraboloid 55b. The revolution paraboloid 55b corresponds to a second reflecting member recited in the claims, and has a parabolic shape which protrudes away from the film formation substrate 10. The opening 55a is provided in a region which includes a vertex of the revolution paraboloid 55b.

As illustrated in FIG. 3, the circular supporting member 54d is provided on an upper end outer circumferential part of the second reflecting member unit 55. In this case, the focal point member 54a is supported so as to face the opening 55a (right above the opening 55a). More specifically, the focal point member 54a is supported in a place which includes a focal point of the revolution paraboloid 55b. Further, the focal point member 54a has a conical shape whose vertex faces the opening 55a.

Of all the members included in the first reflecting member unit 54, at least the focal point member 54a has a temperature that is maintained at a temperature higher than a sublimation temperature or an evaporation temperature (i.e. vaporization temperature) of vapor deposition particles. A surface of the revolution paraboloid 55b also has a temperature that is maintained higher than the vaporization temperature of the vapor deposition particles.

According to this, as illustrated in FIGS. 2 and 3, vapor deposition particles injected from the opening 55a are reflected, with perfectly elastic reflection, by the focal point member 54a toward the revolution paraboloid 55b. Note here that, since the focal point member 54a is supported in the place which includes a focal point of the revolution paraboloid 55b, the vapor deposition particles, which are reflected by the focal point member 54a and then further reflected by the revolution paraboloid 55b, travel in a direction substantially perpendicular to the film formation substrate 10 in accordance with the principle of the parabola. In other words, the vapor deposition flows are injected from the crucibles 50 in a direction substantially parallel to the direction normal to the film formation substrate 10.

Note that, as illustrated in FIGS. 2 and 3, the vapor deposition particles are reflected by the focal point member 54a. Therefore, in a case where the vapor deposition particles reflected by the revolution paraboloid 55b travel in a direction exactly parallel to the direction normal to the film formation substrate 10, the vapor deposition particles do not reach a region of the film formation substrate 10 which region faces the focal point member 54a. Hence, the region is to be a region in which no film is vapor-deposited. This causes no problem since according to the scan vapor deposition method, vapor deposition is carried out while the film formation substrate 10 is moved relatively.

Note that the focal point member 54a and the revolution paraboloid 55b, each of which reflects vapor deposition particles with perfectly elastic reflection, are preferably made of a material which has high thermal conductivity and easily allows a uniform increase in temperature. Examples of the material encompass simple substances such as aluminum nitride, silicon carbide, copper, gold, silver, molybdenum, and nickel and alloys of the simple substances. Alternatively, it is also possible to plate, with any of the above materials, surfaces of the focal point member 54a and of the revolution paraboloid 55b.

Figure 5:
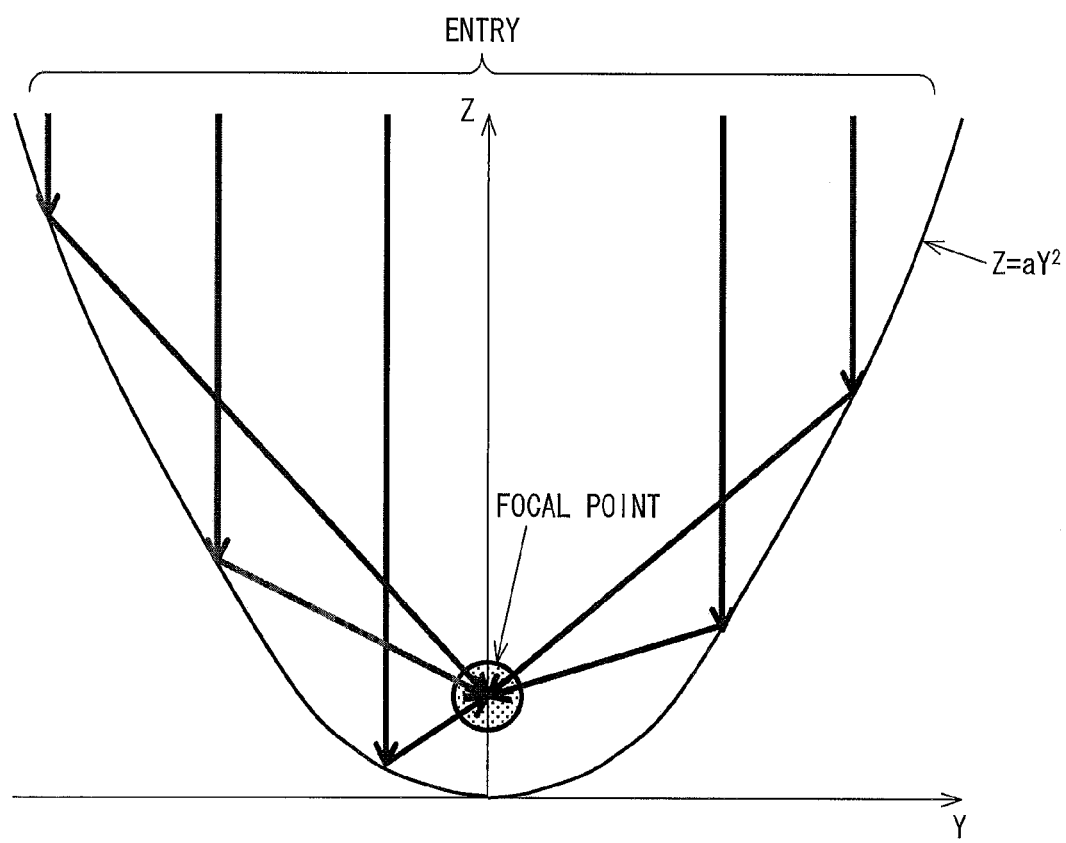
FIG. 5 is a view for describing the principle of the parabola.

FIG. 5 is a view for describing the principle of the parabola. In a case where Y and Z axes extend in horizontal and vertical directions in FIG. 5, respectively, a cross section obtained by cutting a revolution paraboloid along a Y-Z plane is a parabola protruding downwards. Note here that the focal point has coordinates (Y, Z) of (0, 1/(4a)) in a case where the parabola is $Z=aY^2$.

All the vapor deposition particles, which have entered the second reflecting member unit 55 in a direction parallel to the Z axis and have been reflected, with perfectly elastic reflection, by the revolution paraboloid, pass through the focal point. That is, the vapor deposition particles, which have been injected from the focal point and then reflected, with perfectly elastic reflection, by the revolution paraboloid, travel in a direction parallel to the Z axis.

As illustrated in FIG. 2, the focal point member 54a is formed so that vapor deposition particles to be injected from the opening 55a are prevented from being emitted toward the film formation substrate 10. Specifically, in a case where the focal point member 54a has a maximum diameter which is sufficiently larger than a diameter of the opening 55a, all the vapor deposition particles to be injected from the opening 55a are reflected by the focal point member 54a. Note that the focal point member 54a is preferably provided so as to be close to a bottom of the revolution paraboloid 55b.

It is theoretically preferable that the focal point member 54a be small. However, it is known that, if the opening 55a is small, clogging occurs during vapor deposition of a vapor deposition material. Therefore, it is practically preferable that the focal point member 54a have a size of 0.5 mm to 10 mm. An increase in size of the focal point member 54a causes a vapor deposition flow to be less parallel. However, in a case where the revolution paraboloid 55b is sufficiently larger in size than the focal point member 54a, the vapor deposition flow can be prevented from being less parallel. According to Embodiment 1, the opening 55a has a diameter of 2 mm. Further, the revolution paraboloid 55b has the maximum diameter of 50 mm.

Note that, in a case where the focal point member 54a is small in size, a part of the vapor deposition particles injected from the opening 55a is not reflected by the focal point member 54a. In this case, the focal point member 54a is formed so that the revolution paraboloid 55b intersects with a straight line (a dotted arrow illustrated in FIG. 2) that connects (i) an end of a part of the focal point member 54a which part has the maximum diameter and (ii) a part of an outer circumference of the opening 55a which part is closer to the end than any other part of the outer circumference. In other words, the focal point member 54a is formed so as to intersect with a straight line that connects (i) any part of the outer circumference of the opening 55a and (ii) a part of the revolution paraboloid 55b which part is the closest to the film formation substrate 10 and the closest to the any part of the opening 55a. This makes it possible to prevent vapor deposition particles, which have not been reflected by the focal point member 54a, from reaching the film formation substrate 10 without colliding with the revolution paraboloid 55b.

Subsequently, the following description discusses a comparative example in which a conventional vapor deposition apparatus and the vapor deposition apparatus in accordance with Embodiment 1 are compared.

Figure 6:
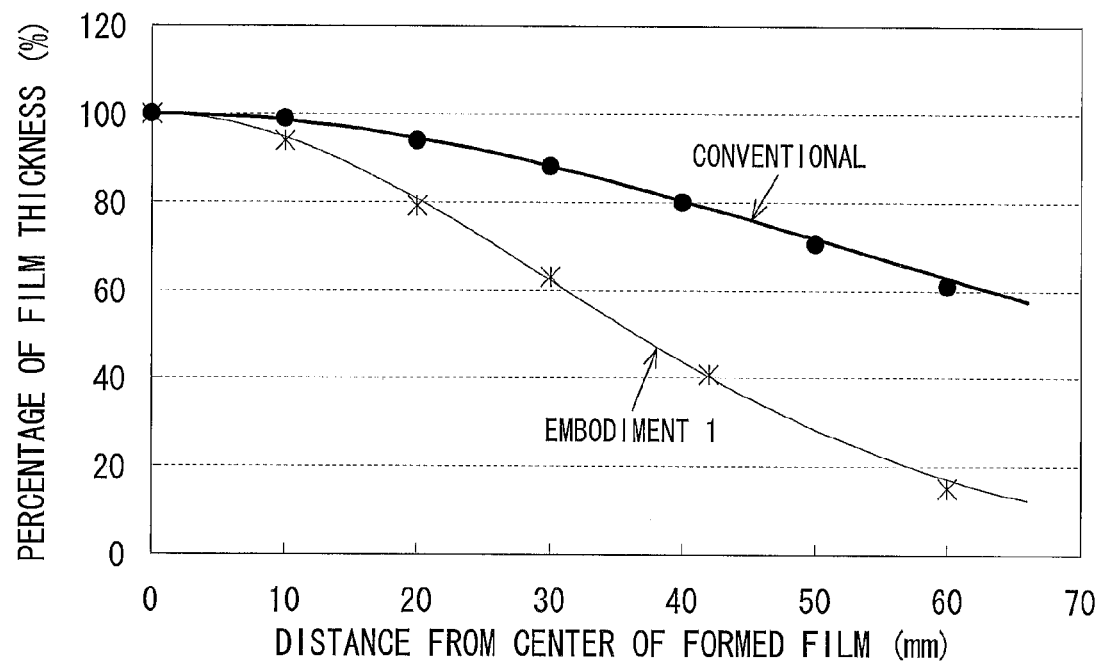
FIG. 6 is a graph illustrating film-thickness distributions of vapor deposition particles injected from conventional crucibles and the crucibles in accordance with Embodiment 1.

FIG. 6 is a graph illustrating film-thickness distributions of vapor deposition particles injected from conventional crucibles and crucibles in accordance with Embodiment 1. In FIG. 6, a bold line indicates the film-thickness distribution of vapor deposition particles injected from the conventional crucibles, and a thin line indicates the film-thickness distribution of vapor deposition particles injected from the crucibles in accordance with Embodiment 1.

Crucibles having respective openings having a diameter of 2 mm and a length of 25 mm were used in the comparative example. Further, a non-alkaline glass substrate was used as a film formation substrate, and Alq3 was used as a vapor deposition material. A distance between the non-alkaline glass substrate and the opening was set to 125 mm, a film formation rate was set to 0.1 nm/sec, and a degree of vacuum in a chamber was set to $10^{-3}$ Pa or less. In addition, a film was formed on the non-alkaline glass substrate so as to have a central thickness of 100 nm. Then, the film-thickness distributions on the film formation substrate were measured in percentages assuming that the central thickness was 100%.

A comparison of the bold line and the thin line shows that the film-thickness distribution indicated by the thin line declines more sharply in proportion to a distance from a center of a formed film than the film-thickness distribution indicated by the bold line. In other words, the crucibles in accordance with Embodiment 1 inject the vapor deposition particles in a direction more parallel to the direction normal to the film formation substrate than the conventional crucibles.

Note that it is known that a film-thickness distribution can be evaluated by an N value. The N value is a value quantitatively indicative of a film formation state (flying/scattering state in a chamber) that is unique to a material. The following description will discuss how to derive the N value.

Figure 7:
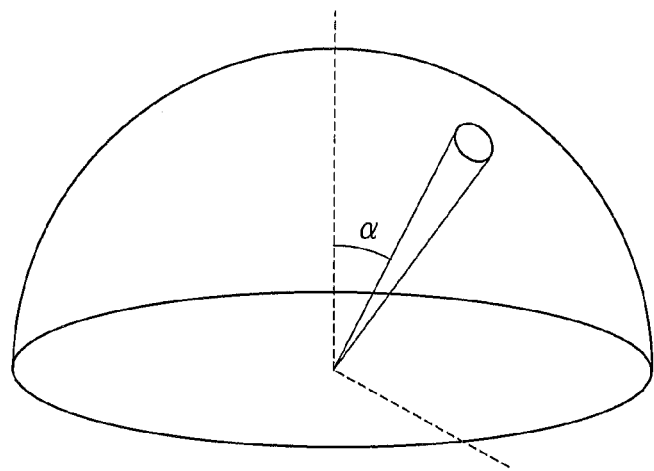
FIG. 7 is a view for describing how to derive an N value.
Figure 8:
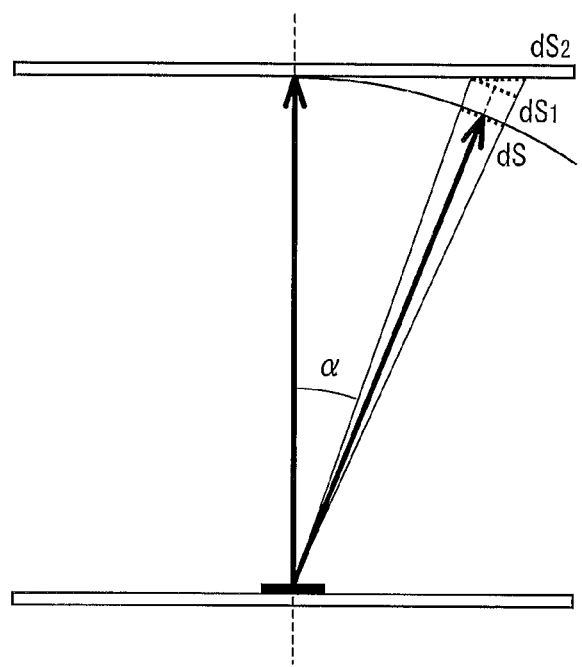
FIG. 8 is a view for describing how to derive the N value.

Assuming that a point vapor deposition source is provided on a plane as illustrated in FIGS. 7 and 8, a density distribution $\phi(\alpha)$ of a vapor deposition flow from that vapor deposition source is found, by Lambert's cosine law, based on the following equation:

$$\Phi(\alpha)=\Phi_0 \cdot \cos\alpha$$

However, the distribution is actually limited because of (i) non-flatness of a vapor deposition surface and/or (ii) an influence of, for example, a wall of an opening.

In a case where (i) an angle α with respect to a direction extending right above the vapor deposition source (see FIG. 7) is not too large and (ii) the vapor deposition source is sufficiently small, the density distribution $\phi(\alpha)$ of the vapor deposition flow from the vapor deposition source can be approximated by the following equation:

$$\Phi(\alpha)=\Phi_0 \cdot \cos^N\alpha$$

Therefore, for example, a vapor deposition rate $R_{sp}(\alpha)$ on a spherical surface having a radius of $L_0$ can be found based on the following equation, where $R_0$ is a vapor deposition rate at a position directly above the vapor deposition source:

$$R_{sp}(\alpha)=R_0 \cdot \cos^N\alpha$$

In a case where the vapor deposition rate $R_{sp}(\alpha)$ is replaced with a vapor deposition rate on a film formation substrate, the vapor deposition rate $R_{sp}(\alpha)$ is multiplied by an amount of an increase in distance $\cos^2\alpha$ and an amount of correction to an angle $\cos \alpha t$.

Therefore, a vapor deposition amount (vapor deposition rate) $R(\alpha)$ per unit area and per unit time at a position on the film formation substrate, which position forms the angle $\alpha$ with the direction extending right above the vapor deposition source, is found based on the following equation:

$$R(\alpha) = R_0 \cdot \cos^N \alpha \times \cos^2 \alpha \times \cos\alpha$$
$$= R_0 \cdot \cos^{N+3} \alpha$$

Note here that performance of the vapor deposition source is indicated by the N value. Note that an element of "+3" is expressed in terms of a geometrical element.

Figure 9:
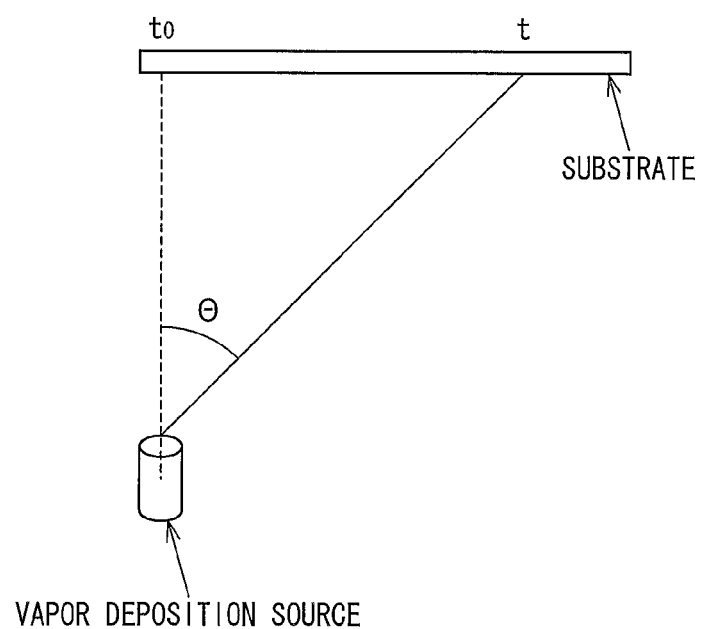
FIG. 9 is a view for describing how to derive the N value.

Therefore, the N value is derived from the following equation:

$$t/t_0 = \cos^{(N+3)}\theta \; [[t/t_0 = \cos^{(N+3)}\Theta]]$$

where, as illustrated in FIG. 9, (i) t is a film thickness at a position on the film formation substrate, which position forms an angle θ with the direction extending right above the vapor deposition source and (ii) $t_0$ is a film thickness at a position on the film formation substrate, which position is located right above the vapor deposition source.

Note here that a measurement result illustrated in FIG. 6 reveals that the conventional crucibles have an N value of 1.5, whereas the crucibles in accordance with Embodiment 1 have an N value of 14.0. The crucibles in accordance with Embodiment 1 thus make it possible to considerably prevent unnecessary expansion of a vapor-deposited film on the film formation substrate.

Next, a shape of the horizontal strut 54c illustrated in each of FIGS. 3 and 4 will be described below. In order not to influence a vapor deposition flow, a cross-section of the horizontal strut 54c is preferably long and narrow in a direction in which the vapor deposition flow travels. Meanwhile, the horizontal strut 54c needs to have a thickness in a horizontal direction which thickness is thick enough to conduct a temperature to the focal point member 54a.

(a) through (c) of FIG. 10 are cross-sectional views each illustrating an example of the horizontal strut 54c. In each of the examples, the horizontal strut 54c has a cross section that is long and narrow in a vertical direction (the direction in which the vapor deposition flow travels).

In the example shown in (a) of FIG. 10, the horizontal strut 54c has a width of 1 mm and a length of 5 mm. The cross sections of the horizontal strut 54c illustrated in (b) and (c) of FIG. 10 each taper downwards. In the examples shown in (a) and (b) of FIG. 10, vapor deposition particles flowing from a lower part to an upper part of FIG. 10 are reflected at a bottom surface of the horizontal strut 54c, so that the vapor deposition particles are blocked and prevented from reaching the film formation substrate. This lowers a film formation efficiency.

In contrast, according to the cross section illustrated in (c) of FIG. 10, the vapor deposition particles are hardly reflected by the horizontal pole 54c. This can prevent a reduction in film formation efficiency. Therefore, the cross section illustrated in (c) of FIG. 10 is the desirable of those illustrated in (a) through (c) of FIG. 10.

According to Embodiment 1, no limiting board is for collimating a vapor deposition flow. However, it is possible to provide a limiting board in a case where a minimal oblique component of the vapor deposition particles is problematic. Also in a case where the limiting board is provided, the vapor deposition particles hardly adhere to the limiting board since the vapor deposition flow is substantially parallel to the direction normal to the film formation substrate.

Embodiment 2

The following description will discuss Embodiment 2 of the present invention with reference to FIGS. 11 and 12. Note that, for convenience, members having functions identical to those of the respective members described in Embodiment 1 are given respective identical reference numerals, and a description of those members is omitted here.

FIG. 11 is a cross-sectional view illustrating a configuration of a container 52' of a crucible in accordance with Embodiment 2. The container 52' is obtained by replacing the first reflecting member unit 54 illustrated in FIG. 2 with a first reflecting member unit 54'. The first reflecting member unit 54' is obtained by replacing the focal point member 54a of the first reflecting member unit 54 with a focal point member 54a'.

The focal point member 54a in accordance with Embodiment 1 has a conical shape, whereas the focal point member 54a' in accordance with Embodiment 2 has a flat-plate shape. This causes a certain amount of vapor deposition particles which are injected from an opening 55a to be bounced back toward a vapor deposition source unit 53.

Hence, vapor deposition particles are emitted in a smaller amount in the configuration of Embodiment 2 than in the configuration of Embodiment 1. This causes a film formation rate to be easily reduced. However, the focal point member 54a', which is simpler in shape than the focal point member 54a, allows a reduction in apparatus cost. In addition, the focal point member 54a' is formed so that a revolution paraboloid 55b intersects with a straight line (a dotted arrow illustrated in FIG. 11) that connects (i) an end of a part of the focal point member 54a' which part has a maximum diameter and (ii) a part of an outer circumference of the opening 55a which part is closer to the end than any other part of the outer circumference. Therefore, also in Embodiment 2, a vapor deposition flow can be collimated to some extent.

FIG. 12 is a graph illustrating film-thickness distributions of vapor deposition particles injected from conventional crucibles and crucibles in accordance with Embodiment 2. In FIG. 12, a bold line indicates the film-thickness distribution of vapor deposition particles injected from the conventional crucibles, and a thin line indicates the film-thickness distribution of vapor deposition particles injected from the crucibles in accordance with Embodiment 2. Measurement conditions such as crucibles, a film formation substrate, and a vapor-deposition material each used in Embodiment 2 are identical to those of Embodiment 1.

A measurement result illustrated in FIG. 12 reveals that the conventional crucibles have an N value of 1.5, whereas the crucibles in accordance with Embodiment 2 have an N value of 7.6. The crucibles in accordance with Embodiment 2 thus make it possible to prevent unnecessary expansion of a vapor-deposited film on the film formation substrate.

Embodiment 3

The following description will discuss Embodiment 3 of the present invention with reference to FIGS. 13 and 14. Note that, for convenience, members having functions identical to those of the respective members described in Embodiment 1 are given respective identical reference numerals, and a description of those members is omitted here.

FIG. 13 is a cross-sectional view illustrating a configuration of a container 52" of a crucible in accordance with Embodiment 3. The container 52" is obtained by replacing the second reflecting member unit 55 illustrated in FIG. 2 with a second reflecting member unit 55'. The second reflecting member unit 55' is obtained by further adding a tubular extending part 55c to the second reflecting member unit 55.

The tubular extending part 55c is a tubular member extending from an outer circumference of an opening 55a toward a focal point member 54a". In other words, an end of the tubular extending part 55c functions as an injection hole from which vapor deposition particles to be supplied from a vapor deposition source unit 53 are injected. It is possible to form the tubular extending part 55c by cutting a tubular member out of a pure copper member and coating the tubular member with Ni.

The above configuration is slightly more complicated in apparatus structure than that of Embodiment 1. However, it is possible to further narrow down a focal region since the injection hole from which the vapor deposition particles are injected is located closer to the focal point member 54a". This allows vapor deposition particles reflected by the focal point member 54a" and a revolution paraboloid 55b to travel in a direction that is more parallel to a direction normal to a film formation substrate 10.

In addition, the focal point member 54a" is formed so that a revolution paraboloid 55b intersects with a straight line (a dotted arrow illustrated in FIG. 13) that connects (i) an end of a part of the focal point member 54a" which part has a maximum diameter and (ii) a part of an outer circumference of the tubular extending part 55c which part is closer to the end than any other part of the outer circumference. This makes it possible to prevent vapor deposition particles, which have not been reflected by the focal point member 54a", from reaching the film formation substrate 10 without colliding with the revolution paraboloid 55b.

FIG. 14 is a graph illustrating film-thickness distributions of vapor deposition particles injected from conventional crucibles and crucibles in accordance with Embodiment 3. In FIG. 14, a bold line indicates the film-thickness distribution of vapor deposition particles injected from the conventional crucibles, and a thin line indicates the film-thickness distribution of vapor deposition particles injected from the crucibles in accordance with Embodiment 3. Measurement conditions such as crucibles, a film formation substrate, and a vapor-deposition material each used in Embodiment 3 are identical to those of Embodiments 1 and 2.

A measurement result illustrated in FIG. 14 reveals that the conventional crucibles have an N value of 1.5, whereas the crucibles in accordance with Embodiment 3 have an N value of 20.5. That is, the crucibles in accordance with Embodiment 3 make it possible to obtain a practically sufficient N value.

[Additional Matter]

According to the above description, the second reflecting members each have a parabolic shape. A second reflecting member does not need to have a completely parabolic shape, and can be a concave curved surface having a shape that is close to a parabolic shape.

Moreover, the above description has discussed the examples each using the scan vapor deposition method in which vapor deposition is carried out while the film formation substrate is relatively moved. However, in a case where the film formation substrate is relatively small, it is also possible to carry out vapor deposition without moving the film formation substrate relatively to the vapor deposition source. In this case, a plurality of crucibles can be provided so as to face a surface of the film formation substrate on which surface a vapor-deposited film is formed, and the plurality of crucibles can be provided in a line or in a matrix pattern. In a case where the film formation substrate is small, vapor deposition can be carried out by use of one or a small number of crucibles.

Furthermore, according to the above description, a plurality of crucibles are provided along a direction perpendicular to both (i) the direction in which the film formation substrate is moved relatively and (ii) the direction normal to the film formation substrate. However, the crucibles can be arranged in a direction that is slightly shifted from a direction perpendicular to a direction in which the film formation substrate is scanned.

<Summary of the Points>

It is thus preferable to configure the crucible in accordance with an embodiment of the present invention such that: the concave curved surface is a revolution paraboloid; and the first reflecting member is located at a focal point of the revolution paraboloid.

With the configuration, it is possible to cause vapor deposition particles reflected by the second reflecting member to travel in a direction substantially parallel to a direction normal to the film formation substrate.

It is preferable to configure the crucible in accordance with the embodiment of the present invention such that the first reflecting member intersects with a straight line that connects (i) any part of an outer circumference of the opening and (ii) a part of the concave curved surface which part is the closest to the film formation substrate and the closest to the any part.

If the first reflecting member is small in size, then there is a risk that part of vapor deposition particles injected from the opening may reach the film formation substrate without being reflected by the first reflecting member. With the configuration, however, it is possible to allow no vapor deposition particles injected from the opening to directly reach the film formation substrate. This prevents a blurred pattern of or incorrect positioning of a vapor-deposited film.

It is preferable to configure the crucible in accordance with the embodiment of the present invention such that the first reflecting member has a conical shape whose vertex faces the opening.

According to the configuration, most of the vapor-deposition particles reflected by the first reflecting member are directed toward the second reflecting member and are not returned to the opening. This allows for an increase in a film formation rate and productivity.

It is preferable to configure the crucible in accordance with the embodiment of the present invention such that the first reflecting member has a flat-plate shape facing the opening.

According to the configuration, the first reflecting member has a simple shape. Therefore, it is possible to reduce an equipment cost.

It is preferable that the crucible in accordance with the embodiment of the present invention further includes: a tubular extending part extending from the outer circumference of the opening toward the first reflecting member.

According to the configuration, an injection hole from which vapor deposition particles are injected is provided closer to the first reflecting member. This allows the focal region to be further narrowed. Therefore, it is possible to cause vapor deposition particles reflected by the first reflecting member and the second reflecting member to travel in a direction more parallel to the direction normal to the film formation substrate.

It is preferable to configure the crucible in accordance with the embodiment of the present invention such that the first reflecting member has a temperature equal to or higher than a temperature at which the vapor deposition particles vaporize.

In a case where the first reflecting member has a temperature lower than the temperature at which the vapor-deposition particles vaporize, the vapor deposition particles adhere to the first reflecting member and it is therefore difficult to collimate the vapor deposition flow. According to the configuration, however, the vapor deposition particles collide with the first reflecting member with perfect elasticity so as to be reflected at an angle identical to that at which the vapor deposition particles collide with a surface of the first reflecting member. This facilitates collimation of the vapor deposition flow.

It is preferable to configure the crucible in accordance with the embodiment of the present invention such that the second reflecting member has a temperature equal to or higher than a temperature at which the vapor deposition particles vaporize.

In a case where the second reflecting member has a temperature lower than the temperature at which the vapor-deposition particles vaporize, the vapor deposition particles adhere to the second reflecting member and it is therefore difficult to collimate the vapor deposition flow. According to the configuration, however, the vapor-deposition particles collide with the second reflecting member with perfect elasticity so as to be reflected at an angle identical to that at which the vapor deposition particles collide with the surface of the second reflecting member. This facilitates collimation of the vapor deposition flow.

A vapor deposition apparatus in accordance the embodiment of the present invention includes at least one crucible recited above.

With the configuration, it is possible to realize a vapor-deposition apparatus capable of high-precision film formation.

It is preferable to configure the vapor deposition apparatus in accordance with the embodiment of the present invention such that the at least one crucible includes a plurality of crucibles that are provided so as to face a surface of the film formation substrate on which surface a vapor-deposited film is formed.

With the configuration, it is possible to handle film formation on a larger film formation substrate.

It is preferable that the vapor deposition apparatus in accordance with the embodiment of the present invention further includes: a vapor deposition mask, provided between a second reflecting member(s) of the at least one crucible and the film formation substrate, for forming a patterned vapor-deposited film on the film formation substrate.

According to the configuration, collimated vapor deposition particles reach the film formation substrate through the vapor deposition mask. This makes it possible to form a pattern with fine pixel units.

It is preferable that the vapor deposition apparatus in accordance with the embodiment of the present invention further includes: a vapor deposition mask for forming a patterned vapor-deposited film on the film formation substrate; and a limiting board for causing the vapor deposition particles to travel in a direction close to a direction normal to the film formation substrate, the vapor deposition mask and the limiting board each being provided between a second reflecting member(s) of the at least one crucible and the film formation substrate.

According to the configuration, vapor deposition particles reflected by the second reflecting member travel in a direction even more parallel to the direction normal to the film formation substrate. This allows further collimation of the vapor deposition flow.

It is preferable that the vapor deposition apparatus in accordance with the embodiment of the present invention further includes: moving means for moving the film formation substrate relatively to the at least one crucible.

If the film formation substrate, in particular, is large in size, it poses the following problem: In a case where a vapor-deposited film is to be formed while the film formation substrate is being still, it is necessary to secure a vapor deposition source region having a size substantially identical to that of the film formation substrate. This requires multiple crucibles and therefore causes an increase in equipment cost. According to the configuration, however, vapor deposition is carried out while the film formation substrate is transported in-line, and therefore the number of crucibles required can be reduced. This allows an equipment cost to be reduced.

It is preferable to configure the vapor deposition apparatus in accordance with the embodiment of the present invention such that the at least one crucible includes or the plurality of crucibles are a plurality of crucibles that are provided along a direction perpendicular to both (i) a direction in which the film formation substrate is moved relatively and (ii) the direction normal to the film formation substrate.

With the configuration, (i) it is easy to align the crucibles with the film formation substrate and (ii) it is possible to cause the vapor deposition apparatus to be small in size.

The present invention is not limited to the description of the embodiments, but can be altered in many ways by a person skilled in the art within the scope of the claims. An embodiment derived from a proper combination of technical means disclosed in different embodiments is also encompassed in the technical scope of the present invention.

INDUSTRIAL APPLICABILITY

The present invention is applicable not only to vapor-deposition of vapor deposition particles during production of an organic EL display device but also to vapor-deposition of vapor deposition particles on any film formation target.

REFERENCE SIGNS LIST

1 Vapor-deposition apparatus
10 Film formation substrate
20 Mask
40 Shutter
50 Crucible
51 Heater
52 Container
52' Container
52" Container
53 Vapor-deposition source unit
54 First reflecting member unit
54' First reflecting member unit
54$a$ Focal point member
54$a$' Focal point member
54$b$ Vertical strut
54$c$ Horizontal strut
54$d$ Circular supporting member
55 Second reflecting member unit
55' Second reflecting member unit
55$a$ Opening
55$b$ Revolution paraboloid
55$c$ Tubular extending part
60 Frame
61 Movable supporting section
62 Fixed supporting section
64 Movable supporting section
70 Supporting base
80 Chamber 81 Vacuum pump mechanism

The invention claimed is:

1. A crucible comprising:
an opening from which vapor deposition particles are injected toward a film formation substrate on which a film is to be formed;
a first reflecting member which is provided so as to face the opening and reflects the vapor deposition particles injected from the opening; and
a second reflecting member which reflects, toward the film formation substrate, the vapor deposition particles reflected by the first reflecting member,
the second reflecting member having a revolution paraboloid surface with respect to the film formation substrate;
the first reflecting member is located at a focal point of the revolution paraboloid.

2. The crucible as set forth in claim 1, wherein the first reflecting member intersects with a straight line that connects (i) any part of an outer circumference of the opening and (ii) a part of the revolution paraboloid surface which part is the closest to the film formation substrate and the closest to the any part.

3. The crucible as set forth in claim 1, wherein the first reflecting member has a conical shape whose vertex faces the opening.

4. The crucible as set forth in claim 1, wherein the first reflecting member has a flat-plate shape facing the opening.

5. A crucible as set forth in claim 1, further comprising:
a tubular extending part extending from the outer circumference of the opening toward the first reflecting member.

6. The crucible as set forth in claim 1, wherein the first reflecting member has a temperature equal to or higher than a temperature at which the vapor deposition particles vaporize.

7. The crucible as set forth in claim 1, wherein the second reflecting member has a temperature equal to or higher than a temperature at which the vapor deposition particles vaporize.

8. A vapor deposition apparatus comprising:
a crucible recited in claim 1.

9. The vapor deposition apparatus as set forth in claim 8, wherein the crucible includes a plurality of crucibles that are provided so as to face a surface of the film formation substrate on which surface a vapor-deposited film is formed.

10. A vapor deposition apparatus as set forth in claim 8, further comprising:
a vapor deposition mask, provided between a second reflecting member of the crucible and the film formation substrate, for forming a patterned vapor-deposited film on the film formation substrate.

11. A vapor deposition apparatus as set forth in claim 8, further comprising:
a vapor deposition mask for forming a patterned vapor-deposited film on the film formation substrate; and
a limiting board for causing the vapor deposition particles to travel in a direction close to a direction normal to the film formation substrate,
the vapor deposition mask and the limiting board each being provided between a second reflecting member of the crucible and the film formation substrate.

12. A vapor deposition apparatus as set forth in claim 8, further comprising:
moving means for moving the film formation substrate relatively to the crucible.

13. The vapor deposition apparatus as set forth in claim 12, wherein the crucible includes a plurality of crucibles that are provided along a direction perpendicular to both (i) a direction in which the film formation substrate is moved relatively and (ii) the direction normal to the film formation substrate.

* * * * *